(12) United States Patent
Shah

(10) Patent No.: US 8,525,720 B2
(45) Date of Patent: Sep. 3, 2013

(54) NON-BINARY SUCCESSIVE APPROXIMATION ANALOG TO DIGITAL CONVERTER

(75) Inventor: Nishit Harshad Shah, Rajkot (IN)

(73) Assignee: Texas Instruments Incorporated, Dallas, TX (US)

( * ) Notice: Subject to any disclaimer, the term of this patent is extended or adjusted under 35 U.S.C. 154(b) by 61 days.

(21) Appl. No.: 13/188,482

(22) Filed: Jul. 22, 2011

(65) Prior Publication Data

US 2013/0021181 A1    Jan. 24, 2013

(51) Int. Cl.
*H03M 1/34* (2006.01)

(52) U.S. Cl.
USPC .......................................... 341/163; 341/155

(58) Field of Classification Search
USPC .................. 341/163, 161, 155, 162, 156, 158, 341/172, 141
See application file for complete search history.

(56) References Cited

U.S. PATENT DOCUMENTS

| | | | |
|---|---|---|---|
| 4,336,526 A | 6/1982 | Weir | |
| 5,138,319 A * | 8/1992 | Tesch | 341/156 |
| 6,486,806 B1 | 11/2002 | Munoz et al. | |
| 6,958,722 B1 | 10/2005 | Janakiraman et al. | |
| 7,425,911 B2 * | 9/2008 | Viswanathan et al. | 341/143 |
| 7,528,761 B2 * | 5/2009 | Draxelmayr | 341/172 |
| 2006/0232461 A1 * | 10/2006 | Felder | 341/161 |

OTHER PUBLICATIONS

J.L McCreary and P.R Gray, "All moss Charge-redistribution analog to digital conversion techniques," vol. 10, No. 6,pp. 371-385, Dec. 1975.

J.P.G. Jianhua and J.Abraham , "Mixed Signal micro-controller for non-binary capacitor array calibration in data converter," in Conference Record of the thirty sixth Asilomar Conference on signals, systems and computers, vol. 2, Nov. 2002, pp. 1046-1049.
William G. Bliss, C. Eric Seaberg and Randall L. Geiger, "A very small sub-binary radix dac for staticpseudo-analong high-precision memory," in proceedings of the 35th Midwest symposium on cercuits and systems, vol. 1, Aug. 1992,pp. 425-428.
L. Cong, Pseudo c-2c ladder-based data converter technique, in IEEE Transactions on Circuits and Systems II: Analog and Digital Signal Processing, vol. 48,0ct. 2001,pp. 927-929.
S.W.M. Chen, "High speed, low-power a/d converter for sub-sampling radio," Ph.D. dissertation, University of California, Berkeley, Spring 2006, pp. 1-112.
F. Kuttner, "A 1.2v 10b 20msample /s non-binary successive approximation adcin 0.13um cmos," in IEEE International Solid-State Circuits Conference, ISSCC 2002 IEEE, pp. 1-2.

* cited by examiner

*Primary Examiner* — Joseph Lauture
(74) *Attorney, Agent, or Firm* — Alan A. R. Cooper; W. James Brady; Frederick J. Telecky, Jr.

(57) ABSTRACT

A successive approximation analog to digital converter (SA-ADC) employs a binary-weighted digital to analog converter (DAC) to perform a non-binary search in determining a digital representation of a sample of an analog signal. In an embodiment, a subset of iterations needed to convert an analog sample to a digital value is performed using non-binary search with a radix of conversion less than two. As a result, search windows in iterations corresponding to the non-binary search overlap, and correction of errors due to a comparator used in the SA-ADC is rendered possible. Error correction being possible due to the non-binary search, the comparator is operated in a low-bandwidth, and hence low-power, mode during the non-binary search. The non-binary search in combination with the binary-weighted architecture of the DAC offer several benefits such as for example, less-complex implementation, shorter conversion time, easier and compact layout and lower power consumption.

18 Claims, 3 Drawing Sheets

NON-BINARY SUCCESSIVE APPROXIMATION ANALOG TO DIGITAL CONVERTER

BACKGROUND

1. Technical Field

Embodiments of the present disclosure relate generally to analog to digital converters, and more specifically to a non-binary successive approximation analog to digital converter.

2. Related Art

Successive approximation analog to digital converters (SA-ADC, also referred to as successive approximation register (SAR) ADC) are often used to generate digital codes representing corresponding samples of an analog signal received as input. SA-ADCs employ the successive approximation principle (SAP) for generation of the digital codes. Approximations of the analog signal are generated, and compared with the analog signal till the digital codes representing the approximations have been resolved to the accuracy of number of bits available in the SA-ADC for representing a sample of the analog signal.

In a binary SA-ADC, the successive approximations are generated in a binary-weighted fashion. Thus, for example, the first approximation may equal half the full-scale range of the SA-ADC, with the following (successive) approximations reducing geometrically by a factor of two (i.e., ¼, ⅛, 1/16, etc) till the least significant bit (LSB) is resolved. Correspondingly, binary SA-ADCs may be said to employ a binary search algorithm, the radix (base) used in the binary search being two.

A non-binary SA-ADC employs a non-binary search to resolve some or all bits of the digital value representing a sample of the analog signal. Thus, the search ranges for successive approximations may reduce geometrically by a factor other than two. For example, the first approximation may equal half the full-scale range of the SA-ADC. But the following (successive) approximations reduce geometrically by a factor of N (N not equal to 2), i.e., $1/N$, $1/N^2$, $1/N^3$, etc.

One prior SA-ADC uses a non-binary weighted digital to analog converter (DAC). A non-binary weighted DAC employs circuit elements (such as capacitors or resistors that are controlled to generate approximations of an analog signal sought to be converted to digital form) that have magnitudes related in a non-binary-weighted fashion. In another prior SA-ADC, the DAC is designed as a thermometric DAC. In general, design of a DAC implemented to employ non-binary weighted elements, i.e., a non-binary weighted DAC, may pose difficulties in the layout stage of implementation of the SA-ADC. Further, the use of a thermometric DAC may require complex logic and layout routing for performing the non-binary search.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

A successive approximation analog to digital converter (SA-ADC) includes a binary-weighted digital to analog converter (DAC), successive approximation register (SAR) logic, and a comparator. The binary-weighted DAC is designed to generate analog outputs iteratively corresponding to digital codes received as input, with each analog output determining the digital value corresponding to a search window. The SAR logic is designed to generate the corresponding digital codes provided to the binary-weighted DAC. The comparator is designed to compare each of the analog outputs with a first voltage to generate corresponding comparison results, the comparison results representing the digital value. The SAR logic is designed to generate the corresponding digital codes to cause search windows in at least one of the pairs of the search windows to be overlapping.

Several embodiments of the present disclosure are described below with reference to examples for illustration. It should be understood that numerous specific details, relationships, and methods are set forth to provide a full understanding of the embodiments. One skilled in the relevant art, however, will readily recognize that the techniques can be practiced without one or more of the specific details, or with other methods, etc.

BRIEF DESCRIPTION OF THE VIEWS OF DRAWINGS

Example embodiments will be described with reference to the accompanying drawings briefly described below.

The drawing in which an element first appears is indicated by the leftmost digit(s) in the corresponding reference number.

DETAILED DESCRIPTION

Various embodiments are described below with several examples for illustration.

1. Successive Approximation Analog to Digital Converter

Figure 1:
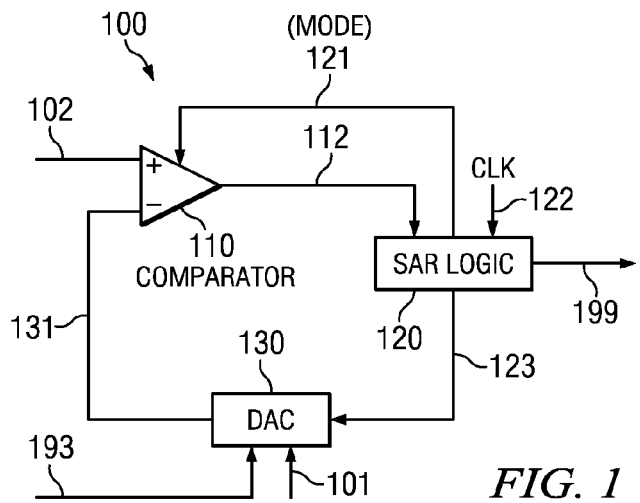
FIG. 1 is a block diagram illustrating the details of a successive approximation analog to digital converter (SA-ADC) in an embodiment.

FIG. 1 is a block diagram of a successive approximation analog to digital converter (SA-ADC) in an embodiment. SA-ADC 100, which may be implemented to employ charge-redistribution (switched-capacitor) techniques, is shown containing comparator 110, SAR logic 120, and digital to analog converter (DAC) 130. An analog input signal sought to be converted to digital form is received on path 101. The digital value representing the magnitude of a sample of analog input 101 is provided on path 199.

SAR logic 120 employs a non-binary search algorithm for determining at least some of the bits of the digital value representing an analog sample 101, and generates corresponding digital codes according to such non-binary search algorithm on path 123. To convert a sample of analog signal 101, SAR logic 120 generates the initial code with a value corresponding to half the full-scale range of SA-ADC 100. SAR logic 120 generates at least some of the following successive digital codes in a non-binary fashion based on the value of the comparison result 112 of an immediately previous iteration. SAR logic 120 may generate the remainder of the digital codes required to completely resolve input 101 and generate the final digital value representing analog input 101 in a (normal) binary fashion. Thus, corresponding to conversion of a single analog sample 101 to its corresponding digital value, SAR 110 generates a "sequence of digital codes" on path 123, the sequence including one sub-set (first subset) of codes generated in a non-binary fashion and another subset (second subset) of codes generated in a binary fashion, as described below.

SAR logic provides the (final) digital value representing a sample of analog signal 101 on path 199. As is well-known, conversion from analog to digital form using the successive approximation principle generally requires a set of successive iterations for conversion of each sample. In each of the iterations, the analog sample is compared with approximations of the analog sample generated by SAR logic 120 (in conjunction with a DAC, as noted below), further approximations that are generated depending on the result of the preceding comparison.

Digital to analog converter (DAC) 130 is implemented as a binary-weighted DAC, and generates iteratively, on path 131, corresponding analog voltages (one analog voltage in each iteration) representing the approximate magnitude of a sample of analog input 101. Binary-weighted DAC 130 samples the analog signal received on path 101 (the sampling duration generally being termed an acquisition phase). DAC 130 then generates intermediate analog voltage 131 with a value equaling (Vdc−Vin+(analog equivalent of the digital code received on path 123)) in each iteration, wherein Vin represents the voltage level of the sampled analog signal 101, and Vdc is the DC voltage on path 102 (typically equaling ground or 0V). Assuming Vdc to be 0V, the analog voltage generated by DAC 130 on path 131, thus, equals the difference of the magnitudes of a sample of analog input 101 and the analog equivalent of the digital code received on path 123. Input analog signal 101 may be provided via a buffer amplifier, not shown in FIG. 1. DAC 130 receives a reference voltage (Vref) on path 193, Vref being used in generating intermediate analog voltages on 131.

Comparator 110 compares intermediate analog voltage 131 with a constant reference voltage (for example, 0V or ground) on path 102 (first voltage), and provides on path 112, the result of the comparison (comparison results). In an embodiment, the result equals a logical value '1' if a sample of an analog signal on path 101 is greater than the signal value corresponding to the intermediate digital value (described below), else the result equals a logical value of '0'. As described further below, comparator 110 is operated in one of two modes, the specific mode being determined by a MODE signal received from SAR logic 120 via path 121. When resolving higher-order bits (most significant bits or MSBs), comparator 110 is operated with relatively lower accuracy, lower gain and wider/larger bandwidth. However, when resolving lower-order bits (least significant bits or LSBs), comparator 110 is operated with relatively greater accuracy, higher gain and smaller bandwidth.

SAR logic 120 receives a clock (CLK) on path 122. The operations of comparator 110, DAC 130 and SAR logic 120 may be synchronized with respect to CLK 122. Thus, the generation of a digital code by SAR logic 120, the generation of the corresponding intermediate voltage 131 by DAC 130 and the corresponding comparison in comparator 110 may all be performed in a single cycle of CLK 122. If SA-ADC 100 has N bits of resolution (i.e., digital output code 199 is N-bits wide), and assuming SAR 120 employs a binary search, N clock cycles may be required (one cycle to resolve each bit) to generate the final output value (199). However, since SAR logic 120 employs non-binary search at least for a portion of the final output 199, more than N clock cycles may be required to generate the final output value 199, the specific total number of cycles varying with the radix of the non-binary search.

2. Non-Binary Search

Figure 2A:
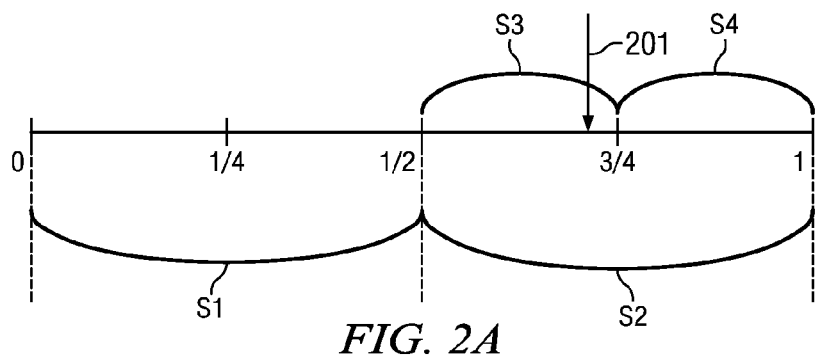
FIG. 2A is a diagram used to illustrate search ranges and thresholds used in a binary search.

FIG. 2A is a diagram used to illustrate search ranges and thresholds in a binary search. Normalized values are used in the description made below with respect to FIGS. 2A and 2B. In FIG. 2A, normalized range 0 to 1 represents the full-scale range of a SA-ADC. The initial approximation (or threshold) of the input voltage is ½ (half). It is determined if the input analog voltage (201) is greater or less than ½. Assuming, as in FIG. 2A, that input 201 is greater than ½, a next approximation (or threshold) of ¾ is made. It is then determined if input 201 is greater than or less than ¾, and the operations are continued till all the bits of the final digital value are resolved (determined). Thus, in binary search, successive search ranges (or search windows) reduce by a factor of 2 (i.e., after T iterations, the search range is $1/(2)^T$).

As may also be appreciated, the (two) search windows corresponding to each iteration are non-overlapping. In the example of FIG. 2A, at the first iteration (for determination of the most significant bit or MSB), the search windows (S1 and S2) have ranges 0 to ½ and ½ to 1 respectively. Similarly, at the second iteration (for determination of the second most significant bit), the search windows (S3 and S4) are ½ to ¾ and ¾ to 1, and so on. It may be observed that S1 and S2 are non-overlapping. Similarly, S3 and S4 are non-overlapping. Search windows used in further iterations are also non-overlapping.

Figure 2B:
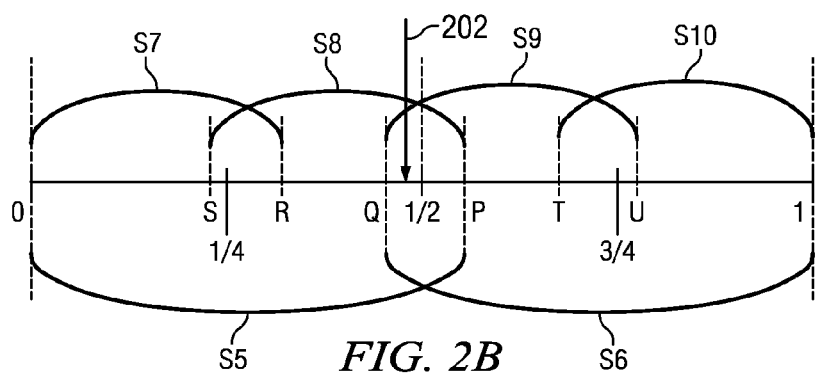
FIG. 2B is an example diagram used to illustrate search ranges in a non-binary search, in which the radix is smaller than two.

FIG. 2B is a diagram used to illustrate search ranges and thresholds in a non-binary search, in which the radix is smaller than 2. In FIG. 2B, normalized range 0 to 1 represents the full-scale range of SA-ADC 100 of FIG. 1. The two initial search windows S5 and S6 now overlap each other partially, as may be observed from FIG. 2B. The initial approximation (or threshold) is still ½, and comparator 110 determines if input 201 is greater than or less than ½. However, due to the redundancy in the digital codes owing to the radix of conversion being less than two, the decision of comparator 110 effectively determines whether input 201 lies in the search window S5 or S6. Search windows of further iterations may also be overlapping. Thus, for the second iteration, the two search windows are S7 and S8 if input 201 is determined as lying in window S5, the search windows being S9 and S10 otherwise. Again, it may be observed that S7 and S8 have an overlap with respect to each other. Similarly, S9 and S10 have an overlap with respect to each other. The overlap in the two search windows of each iteration occurs due to the radix of conversion (the radix of the non-binary search) being less than two. Subsequent iterations may also use corresponding overlapping search windows. Thus, each intermediate analog output generated by DAC 130 on path 131 corresponds to a pair of search windows, the windows in the pair overlapping each other partially.

One benefit of using a radix less than two is that error correction is made possible. Errors made by comparator 110 can be corrected. As an illustration, assume input 202 (provided as input to SA-ADC 100) has a magnitude slightly less than ½ the full-scale of SA-ADC 100, as shown in FIG. 2B. If comparator 110 makes a wrong decision that input 201 is greater than ½, the corresponding search window S6 encompasses the value of input 202, and SA-ADC can correct for the error in subsequent iterations. The binary search scheme of FIG. 2A, on the other hand, can at best conclude that input 202 equals ½, and the result would still be in error.

One advantage of the redundancy available due to the overlapping search windows in each iteration is that comparator 110 may be designed to have a smaller bandwidth, and thus lower power consumption. DAC 130 may also be designed to offer similar advantages. For example, settling errors in DAC 130 can be corrected using such redundancy similar to the manner in which comparator errors are corrected as described above. It is noted here that DAC 130 and comparator 110 together form a 'system' whose transfer function is similar to that of a low-pass filter. Settling errors in either of DAC 130 and comparator 110 reflect in the same manner and can be corrected by enabling such redundancy. While reducing the bandwidth of comparator 110 helps save power, reducing bandwidth of DAC 130 by using decreased switch sizes used in DAC 130 may provide implementation-area reduction. In general, therefore, the use of such redundancy, as noted above, may allow for the overall design of SA-ADC 100 to be less complex, and for the corresponding implementation of SA-ADC 100 to be less power-consuming and less expensive.

Referring to FIG. 2B again, assuming an example radix of 1.84, and that SA-ADC is a 3-bit ADC, the corresponding search ranges are as noted below:

S5={0 to 0.54}
S6={0.46 to 1}

S5 and S6 correspond to the most significant bit.

S7={0 to 0.32}
S8={0.23 to 0.54}
S9={0.46 to 0.77}
S10={0.68 to 1}

S7, S8, S9 and S10 correspond to the second most significant bit.

S11={0 to 0.19}
S12={0.12 to 0.32}
S13={0.23 to 0.42}
S14={0.35 to 0.54}
S15={0.46 to 0.65}
S16={0.58 to 0.77}
S17={0.68 to 0.88}
S18={0.81 to 1}

S11 through S18 correspond to the least significant bit. Search ranges S11 through S18 are not shown in FIG. 2B. With ranges S5 through S18 as noted above, points P, Q, R, S, T and U in FIG. 2B respectively equal 0.54, 0.46, 0.32, 0.23, 0.68 and 0.77, assuming a radix of 1.84. The redundancies d1, d2 and d3 corresponding to the three bits are respectively 0.043, 0.045 and 0.036.

The threshold voltage corresponding to a search window is as specified in Equation 1 below:

$$\text{Threshold} = (BP+EP)/2 \qquad \text{Equation 1}$$

wherein,

BP denotes the beginning point of the search window,
EP denotes the end point of the search window.

As depicted in the example, the search window corresponding to the first iteration is 0 to 1, and the corresponding threshold is 0.5. The threshold corresponding to search window S5 equals 0.27, being the average of 0 and 0.54, the respective BP and EP for the window. Thresholds for the other search windows may be similarly determined.

The redundancy (di) at each iteration is specified by the equation below:

$$d(i) = (½^i) - (1/r^i) \qquad \text{Equation 2}$$

wherein, r is the radix, and i is the iteration index, and has a range 0 to Z−1, wherein Z is the number of iterations required to resolve the digital value representing an analog sample to N binary bits. The correspondence between Z and N depends on the radix r chosen.

Search windows for each iteration are determined as described below:

Initial search window is (0 to 1), the full-scale of SA-ADC 100, the BP and EP being 0 and 1 respectively. For subsequent iterations, the BP and EP for the corresponding search window are modified as follows:

If the output of comparator 110 in the immediately previous iteration is a logic one, then the BP for the current iteration is modified to (threshold (binary-i)−d(i)), and EP is left unmodified, . . . Condition (1)

and

If the output of comparator 110 for the immediately previous iteration is a logic zero, then the EP for the current iteration is modified to (threshold (binary-i)+d(i)) and BP is left unmodified. . . . Condition (2)

wherein, i is the iteration index, and threshold (binary-i) represents the threshold for the $i^{th}$ iteration corresponding to the binary search case.

The determination of search windows is illustrated below with examples. In the example below, it is assumed that a radix of 1.84 is chosen for the non-binary search. The specific thresholds and therefore the search windows may be different for other radices. As noted above, for the first iteration, index i equals 0, d(i) also equals 0 (from Equation 2), neither of BP or EP is modified, and the search window is (0 to 1), as also noted above. For the second iteration, the search windows are S5 and S6 (as shown in the example of FIG. 2B), index i equals 1, and d(i) equals 0.043 (from Equation 2, with radix r equaling 1.84).

Thus, if the output of comparator 110 is a logic one for the first iteration (index i equals 0), the search window corresponds to S6, with a BP of (0.5-0.043), which equals 0.46 (with rounding off beyond the third decimal position), and an (unmodified) EP of 1. Thus, search window S6 equals the range (0.46 to 1), as also noted above. On the other hand, if the output of comparator 110 is a logic zero for the first iteration, the search window corresponds to S5, with an EP of (0.5+0.043), which equals 0.54 (with rounding off beyond the third decimal position), and an (unmodified) BP of 0. Thus, search window S5 equals the range (0 to 0.54), as also noted above. Subsequent search windows (S7, S8, etc) can be determined similarly by application of Equation 1, Equation 2, Condition (1) and Condition (2).

As noted above, DAC 130 is implemented as a binary-weighted DAC, but the 'non-binary' thresholds (noted above) are generated by the application of appropriate DAC words by SAR logic 120. In an embodiment, binary-weighted DAC 130 is designed to employ charge redistribution techniques, as described next.

3. Circuit Implementation

Figure 3:
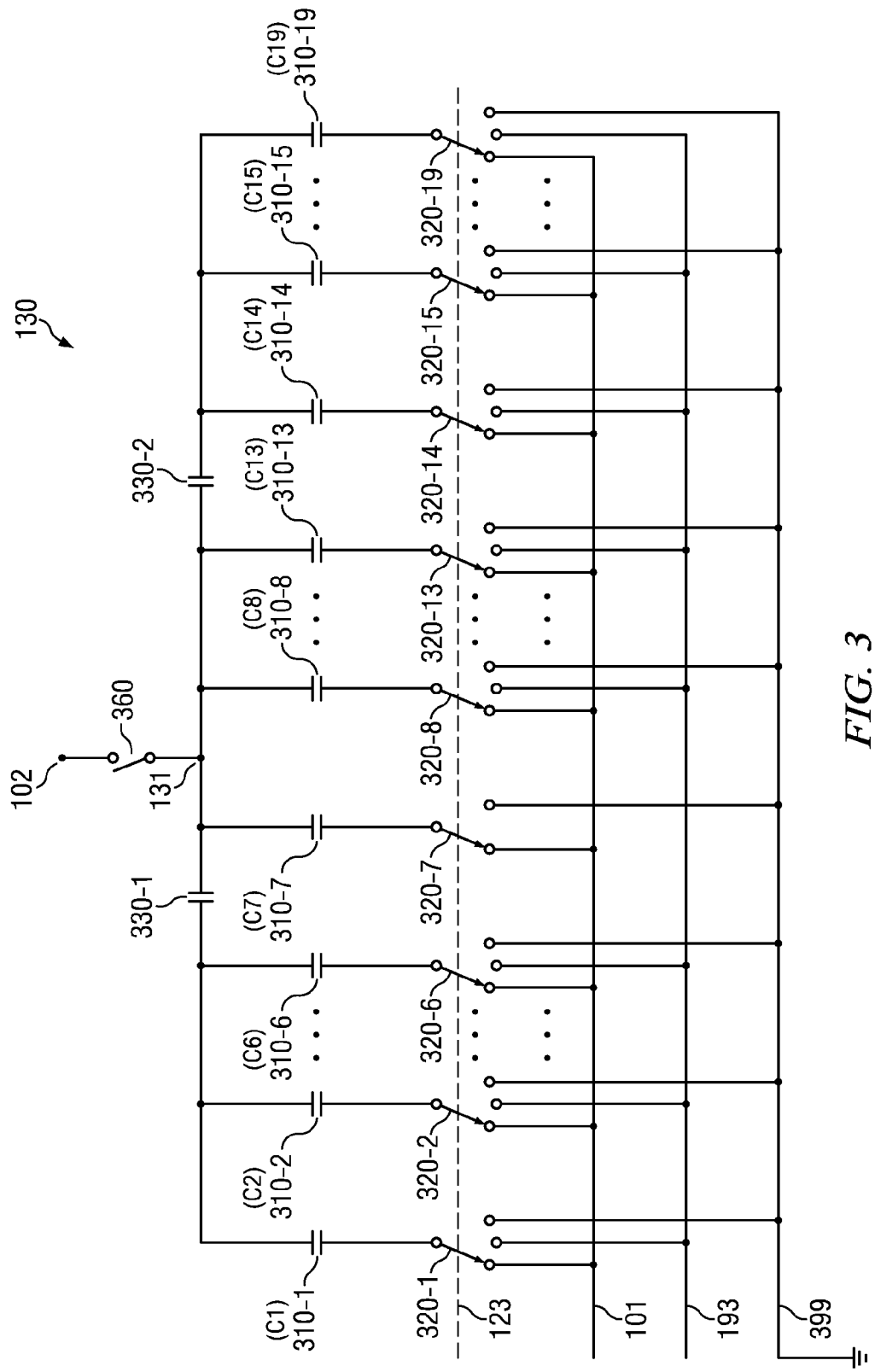
FIG. 3 is a diagram illustrating the details of a binary-weighted digital to analog converter (DAC) used in a SA-ADC, in an embodiment.

FIG. 3 is a diagram of DAC 130 implemented as charge redistribution DAC in an embodiment. In the embodiment, DAC 130 is implemented to provide an N-bit (binary output) representation of each analog sample of input 101. DAC 130 employs non-binary search to determine the first M binary bits of the N-bit binary digital output, and normal binary search subsequently to determine the less significant (N−M) binary bits of the N-bit binary digital output. The radix of conversion used for determination of the M most significant binary bits equals R. However, other values for radix 'r' may be used in other embodiments.

Further, while the description below is provided with respect to a charge redistribution or switched-capacitor DAC, DACs implemented according to other well-known techniques (such as, for example, using binary-weighted resistors) can instead be used in other embodiments. Accordingly, the components (whether capacitors, resistors, etc.) used in DAC 130 (with magnitudes in a binary-weighted fashion) may be viewed as elements that set search windows, i.e., search-window setting elements, based on the corresponding bit(s) of a digital code received from SAR logic 120, as described below. It is noted that when using a DAC with binary-weighted resistors, the connections of the blocks of FIG. 1 get modified slightly, with path 102 receiving analog signal (shown provided on path 101), and path 101 being removed. Such a DAC would employ the resistors in a known way to generate corresponding approximations of the analog input on path 131.

Binary-weighted DAC 130 of FIG. 3 is shown containing capacitors 310-1 through 310-19 (respectively labeled C1 through C19), capacitors 330-1 and 330-2, switches 320-1 through 320-19 and switch 360. Capacitors C1 through C13 are used to determine the M most significant binary bits using non-binary search, while capacitors C14 through C18 are used to determine the (N−M) least significant binary bits using conventional binary search. Capacitor C19 is used to correct for error in the least significant of the M most significant bits obtained by the non-binary search.

For the non-binary search, since the radix of conversion is less than two (R in the embodiment), more than M cycles or iterations are required to determine the M binary bits. The equivalence between the number of iterations (Z) required to obtain M binary bits of accuracy using a radix of r is specified by the following relationship:

$$Z = \text{ceil}[M^* \ln(2)/\ln(r)] \qquad \text{Equation 3}$$

wherein, ln represents the natural logarithm operator, and ceil represents the ceiling operator, and is defined as given below:

ceil [X] is the smallest integer not less than X.

The relation of Equation 3 results from the fact that $r^Z$ must equal $2^N$. From Equation 3, with M equal to 7, and R equal to 1.81, Z evaluates to 9. Thus, non-binary search is used to determine Z non-binary bits (at radix of R) equivalent to M binary bits (at radix of 2). The thresholds to be applied (described in greater detail below with respect to FIG. 3) can be computed from Condition (1), Condition (2) and Equation 1 noted above. In the embodiment, A bits (here, twelve bits) are used to represent each of the redundancies di to minimize quantization errors in the representation of the 'd(i)'s, i.e., the 'd(i)'s are represented to A-bit accuracy. Since Z iterations are required, d(i) for each of the last (Z−1) thresholds need to be computed according to Equation 2, d(i) being 0 for the first iteration, as also noted above.

The values of capacitors C1 through C6 are related in a binary-weighted manner. Thus, assuming C6 corresponds to the most significant bit (MSB) capacitor among capacitors C1 through C6, the capacitance values of C6, C5, C4, C3, C2 and C1 are respectively k, k/2, k/4, k/8, k/16 and k/32, wherein k is a suitable capacitance value. The values of capacitors C7 through C13 are also related in a binary-weighted manner. Thus, assuming C13 corresponds to the MSB capacitor among capacitors C7 through C13, the capacitance values of C13, C12, C11, C10, C9, C8 and C7 are respectively p, p/2, p/4, p/8, p/16, p/32 and p/32, wherein p is a suitable capacitance value. The charge provided by 'balance capacitor' C7 is the smallest (among capacitors C1 through C13) and equals to $2^{(-6)}$ of the full scale charge. Similarly, capacitance values of C19, C18, C17, C16, C15 and C14 are respectively q, q/2, q/4, q/8, q/16 and q/32, wherein q is a suitable capacitance value. The values of p, k and q may be selected to facilitate easy implementation in integrated circuit (IC) form.

Capacitors 330-1 and 330-2 facilitate the selection of capacitance values of capacitors C1 through C19 to be practically feasible. Switches 320-1 through 320-19 are controlled by SAR logic 120 via path 123 (which may contain multiple separate paths), and are operable to connect respective capacitors C1 through C19 (except C7) to one of input 101, Vref 193 or ground 399. Switch 320-7 is controllable to connect capacitor C7 to input 101 or ground 399.

Capacitors C1 through C13 are used in a 'coarse conversion' phase to obtain the most significant Z non-binary bits (equivalent to M binary bits). Capacitor C19 is then used to correct for the inaccuracy of the coarse conversion in the Z non-binary bits obtained. The correction phase is termed Dynamic Error Correction (DEC), and is described further below. 'Fine conversion' is then performed to obtain the lowermost (N−M) binary bits using normal binary search.

When performing coarse conversion (i.e., when determining the Z non-binary bits using non-binary search), comparator 110 is used in a 'coarse' mode (with lower accuracy/higher noise), and is therefore operated to consume relatively lower power to minimize power consumption. Potential errors made by comparator 110 may be corrected by the non-binary search, as described above.

When performing fine conversion (i.e., when determining the (N−M) least significant binary bits using binary search), comparator 110 is used in a 'fine' mode (with higher accuracy/lower noise) and correspondingly higher power consumption. SAR logic 120 may indicate via path 121 (MODE signal) whether comparator 110 is to operate in a 'coarse' or 'fine' mode. On receipt of the corresponding value of the MODE signal, comparator 110 automatically configures itself to operate accordingly in the corresponding mode. For example, if the MODE signal indicates that comparator 110 is to operate in the 'fine' mode, its bandwidth may be reduced by adding additional load. Also, the gain of comparator 110 may be increased by adding a few extra stages to resolve the reduced value of the least significant bit. In an embodiment, comparator 110 is operated to have M-bit accuracy for the coarse conversion and N-bit accuracy for the fine conversion.

Although, the same comparator (110) is noted above as being used for both the 'coarse' and 'fine' conversions, in other embodiments separate comparators may be used, one for the coarse conversion and the other for the fine conversion. The comparator used for the coarse conversion may be designed with less stringent noise requirements and therefore consume lesser power, while the comparator used for the final (N−M) fine conversions may be designed with more stringent noise requirements.

During the sampling phase of operation of DAC 130, switch 360 is closed, and switches 320-13 through 320-7 connect the respective capacitors C13 through C7 to path 101. Thus, one end (top plate) of each of capacitors 310-13 through 320-7 is coupled to the DC voltage (typically ground or 0V) on path 102, while the other end (bottom plate) of each of capacitors C13 through C7 is connected to analog signal 101. As a result, the analog signal on path 101 is sampled on capacitors C13 through C7. The remaining capacitors C6 to C1 and C18 to C14 can be held at a fixed voltage (generally ground). Switch 320-19 connects capacitor C19 to Vref (193), and capacitor C19 charges to Vref. Capacitor 320-19 (C19) is used to correct for error in the resolved bits of the Z-bit non-binary code obtained using capacitors C1 through C13, as described further below.

During the conversion phase of operation of DAC 130, switch 360 is opened. The conversion phase of operation may be viewed as containing a coarse conversion phase, a dynamic error correction phase and a fine conversion phase, in that order in time. In the coarse conversion phase, the bottom plates of capacitors C1 through C6, and C8 through C13 are either connected to Vref 193 or ground 399 by the corresponding switches. Thus, a total of (A) switches (320-1 through 320-6 and 320-8 through 320-13) are operated to connect to one of Vref 193 or ground 399 by corresponding A-bit code word received from SAR logic 120 on path 123. C13 corresponds to the most significant bit capacitor for the coarse phase. Capacitors C6 through C1 represent the successive lower order bit capacitors, with C1 being the least significant bit capacitor. In the coarse phase, switches 320-14 through 320-18 are connected to ground 399. Switch 320-19 continues to connect capacitor C19 to Vref (193).

As noted above, the A-bit code words generated by SAR logic 120 represent corresponding threshold voltages for the corresponding iterations. Thus, for the first iteration, the threshold being ½, a code word $[10 \ldots 0]_b$ (b signifying that the word is in binary) is sent by SAR logic 120 on path 123. The MSB of the code word being a logic one, switch 320-13 connects the bottom plate of C13 to Vref 193. All other bits of the code word are logic zero, and the bottom plates of capacitors C12 through C8 and C6 through C1 are connected to ground 399. The corresponding intermediate analog signal on path 131 is compared with voltage 102 by comparator 110 (now operating in the coarse mode). The threshold being equal to ½, effectively, the comparison determines if the sampled input 101 is greater than or less than half the full-scale output of SA-ADC 100. The comparison result (either a logic one or a logic zero) provided by comparator 110 on path 112 specifies whether input 101 is greater than or less the threshold of ½.

Based on whether comparator output 112 is a logic one or a logic zero, SAR logic 120 generates the next threshold on path 123. Thus, for example, assuming output 112 was a logic one, input 101 has a magnitude between ½ and 1 of the full-scale range of SA-ADC 100. SAR logic 120 generates another A-bit code word representing the next threshold. For illustration, had the radix of conversion been 1.84 (instead of 1.81 as assumed for the embodiment), SAR logic 120 would generate a 12-bit code word representing the next threshold of 0.73, 0.73 being the mid-point of search window S6 noted with respect to FIG. 2B. On the other hand, assuming output 112 was a logic zero, input 101 has a magnitude between 0 and ½ of the full-scale range of SA-ADC 100, and SAR logic 120 would instead generate a 12-bit code word representing a next threshold of 0.27, 0.27 being the mid-point of search window S5. For a radix of 1.81, SAR logic 120 generates the appropriate 12-bit code word representing the corresponding threshold.

Again, the A-bit code word controls the connection of the bottom plates of capacitors C13 through C8 and C6 through C1 based on whether the corresponding bit of the A-bit code is a logic one or a logic zero, in a manner similar to that illustrated above for the first iteration value of $[10 \ldots 0]_b$. The intermediate analog voltage on path 131 corresponding to the A-bit code for the second iteration is compared with voltage 102, and comparator output 112 is provided to SAR logic 120. Further iterations (a total of Z in the coarse conversion phase) to determine all Z non-binary bits are performed in a similar manner. The thresholds (and hence the corresponding A-bit digital code words generated by SAR logic 120) are determined, and the corresponding operations (similar to those noted above) are repeated till the Z non-binary bits (equivalent to M binary bits) are obtained.

In an embodiment, the A-bit code words are stored in a look-up table (in the form of non-volatile memory) contained within SAR logic 120. The A-bit code words are pre-computed based on the radix r that is to be used for each corresponding d(i) value (according to Equation 2 noted above). The beginning point, end point and each of the Z thresholds of the corresponding search windows are computed in SAR logic 120 (according to Equation 1, Condition 1 and Condition 2, also noted above).

Since comparator 110 is used in a lower accuracy mode (M-bit accuracy in the embodiment) in the coarse conversion phase (first operating phase), one or more of the comparison results generated by comparator 110 may be in error. The non-binary search technique corrects for such error as noted above. However, the least significant of the M bits obtained at the end of the coarse conversion phase may still be in error (again due to the lower-accuracy of comparator 110). To correct such error, dynamic error correction (third operating phase) is performed immediately following the coarse conversion phase. Capacitor C19 is used for dynamic error correction (DEC). In the DEC phase, comparator 110 is operated with higher accuracy (N-bit accuracy in an embodiment). C19 is used to change the voltage on the top plate by connecting switch 320-19 to either VREF 193 or ground 399, thereby bringing the top-plate voltage difference within the convergence range of subsequent conversions.

After the DEC, the remaining (N−M) bits are determined using binary search in the normal manner. Since binary search is used for the fine conversion phase (second operating phase), (N-M) iterations (one iteration for each bit) are required to determine the values of the least significant (N−M) bits of the final N-bit binary value representing a sample of input 101. Capacitors C14 through C18 are successively (in successive iterations) connected either to Vref 193 or ground 399, the corresponding value of voltage 131 is compared with voltage 102 by comparator 110 (now operating in the higher accuracy mode, N-bit accuracy in an embodiment). The operation in the fine conversion phase is similar to the operation of charge redistribution DAC in conventional implementations, such as for example, as described in the following paper: "All MOS charge redistribution analog-to-digital conversion techniques" by J. McCreary and P. Gray, IEEE JOURNAL OF SOLID-STATE CIRCUITS, DECEMBER 1975.

Z non-binary bits and (N−M) binary bits are thus obtained. The Z non-binary bits are converted to the equivalent M binary bits in SAR logic 120. The conversion may be performed by SAR logic 120 using a look-up table (contained within SAR logic 120) that stores the mapping between the Z-bit values and the corresponding M-bit binary values. Thus, SAR logic 120 generates an N-bit binary output representing the sampled value of input 101.

A potential drawback of DAC 130 of FIG. 3 is that the two 'series' capacitors (330-1 and 330-2) may require accurate compensation for parasitic capacitances to generate accurate threshold voltages. Such parasitic capacitances may exist across the top and bottom plates of 330-1 and 330-2 and also from the bottom plates of 330-1 and 330-2 to ground. DAC 430 of FIG. 4 overcomes such a drawback by eliminating the need for one of the series capacitors.

Figure 4:
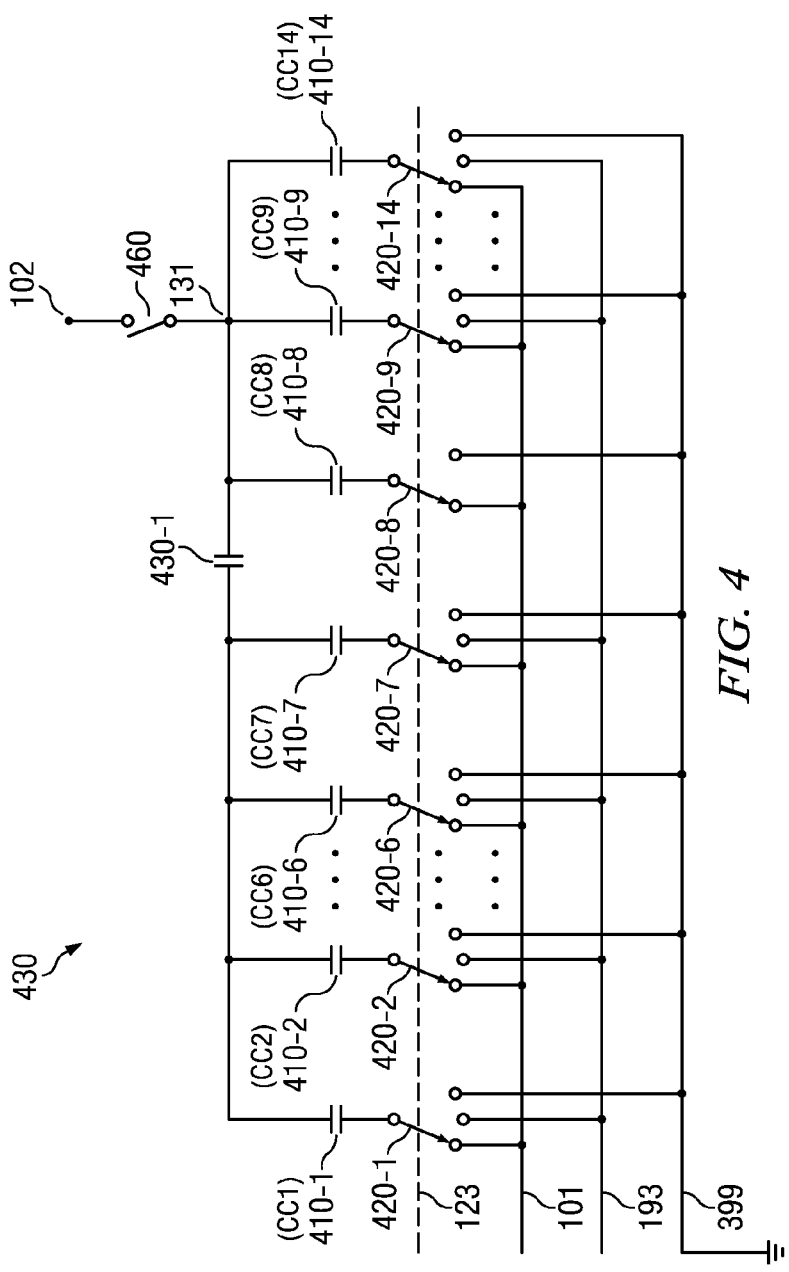
FIG. 4 is a diagram illustrating the details of a binary-weighted DAC used in a SA-ADC, in an alternative embodiment.

Binary-weighted DAC 430 of FIG. 4 is shown containing capacitors 410-1 through 410-14 (CC1 through CC14 respectively), capacitor 430-1, switches 420-1 through 420-14 and switch 460. It may be observed that, unlike DAC 130 of FIG.

3, only one series capacitor (430-1) is used, and thus the drawback noted with respect to DAC 130 of FIG. 4 is minimized CC8 is used as a balance capacitor, and CC6 is used for DEC. DAC 430 of FIG. 4 is implemented to provide a N-bit (binary) digital code representing a sample of input 101. Again, the most significant Z non-binary bits are determined using non-binary search in a coarse conversion phase, with comparator 110 being operated in the lower accuracy mode and with lower power consumption. Following the coarse conversion, one DEC cycle is performed. Finally, the lowermost (N−M) significant bits are determined using binary search. Comparator 110 is operated in the high accuracy mode for the DEC and the fine conversion phases.

However, as may be observed from FIG. 4, unlike DAC 130 of FIG. 3, separate capacitor banks for coarse and fine conversion are not provided. SAR logic 120 writes corresponding A-bit code words to capacitors CC1 through CC5, CC7 and CC9 through CC14 (12 capacitors in all) to obtain the Z non-binary bits in a manner similar to that described with respect to DAC 130 of FIG. 3. For the fine conversion phase to obtain the least significant (N-M) binary bits, the last A-bit DAC word (written immediately prior to the start of the fine conversion phase) is updated in each of the (N−M) remaining iterations by adding the appropriate code word for determining the (N−M) bits. The addition may be performed by corresponding adder circuitry implemented within SAR logic 120.

As an example, assuming that the last 12-bit DAC word (generated by SAR logic 120 on path 123 immediately prior to start of the fine conversion phase) is $[110000010010]_b$, the 12-bit word $[000000010000]_b$ is added to $[110000010010]_b$, and the sum $[110000100010]_b$ is written. The 12-bit word $[000000010000]_b$ has a logic one at the fifth bit position.

For determination of the remaining bits, the logic one in the 12-bit word $[000000010000]_b$ is successively shifted right by one bit at every iteration, the word thus obtained is added to the 12-bit word last written, and the resulting 12-bit sum is applied to the capacitor array formed by CC1 through CC5, CC7 and CC9 through CC14. Thus, for example, for determination of the fourth bit, the word $[000000001000]_b$ is added to the sum $[110000100010]_b$, which is the DAC word that was written immediately prior to determination of the fourth bit. The final DAC word obtained after the five iterations represents the digital value equivalent to the analog sample 101.

The use of a binary-weighted DAC (DAC 130 or DAC 430) to perform the non-binary search may provide several benefits over other techniques. For example, implementation of non-binary weighted capacitors may either be difficult in terms of implementation or may pose problems during the layout phase of the circuit. Further, non-binary weighted capacitors may also be associated with inaccuracies.

One prior technique that uses non-binary search uses a thermometric DAC to generate the non-binary thresholds. However, such an approach may not be desirable at least due to the relatively large number of switches and layout complexity associated with such an approach.

SA-ADC 100 implemented with DAC 130 of FIG. 3 or DAC 430 of FIG. 4, along with the corresponding operations by SAR logic 120, may be associated with relatively lower overall power consumption due to the use of comparator 110 in a lower-power mode for the non-binary search. Further, the non-binary search enables redundancies, and can correct for decision errors made by comparator 110 in the non-binary search phase.

An SA-ADC implemented as described above can be incorporated as part of a larger system. The description is continued with reference to such an example system.

4. Example System

Figure 5:
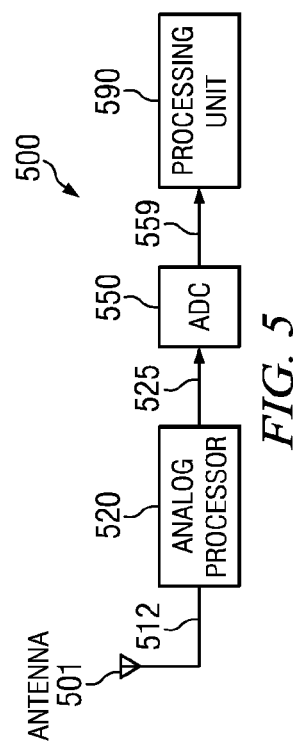
FIG. 5 is a block diagram of an example receiver system incorporating an SA-ADC in an embodiment.

FIG. 5 is a block diagram of an example receiver system 500. Receiver system 500 may correspond to receivers such as a Global Positioning System (GPS) receiver, communication receivers such as an FM (frequency modulation) receiver, etc. Receiver system 500 is shown containing antenna 501, analog processor 520, ADC 550, and processing unit 590.

Antenna 501 may receive various signals transmitted on a wireless medium. The received signals may be provided to analog processor 520 on path 512 for further processing. Analog processor 520 may perform tasks such as amplification (or attenuation as desired), filtering, frequency conversion, etc., on the received signals and provides the resulting processed signal on path 525.

ADC 550 converts the analog signal received on path 525 to corresponding digital values, which are provided on path 559 for further processing. ADC 550 may be implemented as a SA-ADC according to techniques described in detail above. Processing unit 590 receives the data values on path 559, and processes the data values to provide various user applications.

It may be appreciated that various modifications can be made to the embodiments/approaches described above. For example, the DACs of FIG. 3 and FIG. 4 are shown implemented using switched-capacitor techniques. However, the DACs can be implemented in several other ways well known in relevant arts as well.

Similarly, even though the description of above is provided with reference to single-ended circuits, the approaches described above can be extended to differential circuits, as will be apparent to one skilled in the relevant arts by reading the disclosure provided herein.

While in the illustrations of FIGS. 1, 3, 4 and 5, although terminals/nodes are shown with direct connections to various other terminals, it should be appreciated that additional components (as suited for the specific environment) may also be present in the path, and accordingly the connections may be viewed as being electrically coupled to the same connected terminals. In the instant application, power and ground terminals are referred to as constant reference potentials.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A successive approximation analog to digital converter (SA-ADC) to convert a sample of an analog signal to a digital value in a set of iterations, said SA-ADC comprising:

a successive approximation register (SAR) logic to generate a sequence of digital codes, the sequence representing a complete set of digital codes required to be generated for the determination of the digital value representing the magnitude of the sample, each digital code in the sequence being generated in a corresponding iteration in the set of iterations, and wherein at least a first subset of the sequence of digital codes is generated according to a non-binary search technique;

a binary-weighted digital to analog converter (DAC) to receive the sequence of digital codes and to generate corresponding analog outputs; and a comparator to compare the corresponding analog outputs with a first voltage to generate corresponding comparison results, wherein the comparison results represent the digital value, wherein the binary-weighted DAC contains a plurality of search-window setting elements designed to have values according to a binary-weighted technique.

2. The SA-ADC of claim 1, wherein search windows in iterations in which the first subset of the sequence of digital codes is generated are overlapping.

3. The SA-ADC of claim 1, wherein the binary-weighted DAC is designed to employ charge-redistribution techniques, wherein each of the plurality of search-window setting elements is a capacitor, wherein the first voltage is a constant reference potential.

4. The SA-ADC of claim 3, wherein the non-binary search is performed using a radix of conversion less than two.

5. The SA-ADC of claim 4, wherein the sequence of digital codes includes a second subset of digital codes, wherein the second subset of digital codes is generated according to a binary search technique.

6. The SA-ADC of claim 5, wherein in a first operating phase of the SA-ADC in which the first subset of the sequence of digital codes is generated, the comparator is designed to operate with a first bandwidth and a first gain, wherein in a second operating phase of the SA-ADC in which the second subset of the sequence of digital codes is generated, the comparator is designed to operate with a second bandwidth and a second gain, wherein the first bandwidth is wider than the second bandwidth, and the first gain is less than the second gain.

7. The SA-ADC of claim 6, wherein errors in the first subset are corrected in a third operating phase, wherein the third operating phase is between the first operating phase and the second operating phase.

8. The SA-ADC of claim 7, wherein the binary-weighted DAC comprises a first capacitor bank containing a first plurality of capacitors and a second capacitor bank containing a second plurality of capacitors, wherein codes in the first subset are applied on capacitors of the first capacitor bank, codes in the second subset being applied on capacitors of the second capacitor bank.

9. The SA-ADC of claim 7, wherein the binary-weighted DAC comprises a plurality of capacitors, wherein codes in the first subset as well as the second subset are applied on capacitors in the plurality of capacitors.

10. A device comprising:
an antenna to receive a signal on a wireless medium;
an analog processor to process the signal and to generate a processed signal;
a successive approximation analog to digital converter (SA-ADC) to convert a sample of the processed signal to a digital value in a set of iterations; and
a processor to process the digital value, wherein the SA-ADC comprises:
a successive approximation register (SAR) logic to generate a sequence of digital codes, the sequence representing a complete set of digital codes required to be generated for the determination of the digital value representing the magnitude of the sample, each digital code in the sequence being generated in a corresponding iteration in the set of iterations, and wherein at least a first subset of the sequence of digital codes is generated according to a non-binary search technique;
a binary-weighted digital to analog converter (DAC) to receive the sequence of digital codes and to generate corresponding analog outputs; and
a comparator to compare the corresponding analog outputs with a first voltage to generate corresponding comparison results, wherein the comparison results represent the digital value,
wherein the binary-weighted DAC contains a plurality of search-window setting elements designed to have values according to a binary-weighted technique.

11. The device of claim 10, wherein search windows in iterations in which the first subset of the sequence of digital codes is generated are overlapping.

12. The device of claim 10, wherein the binary-weighted DAC is designed to employ charge-redistribution techniques, wherein each of the plurality of search-window setting elements is a capacitor, wherein the first voltage is a constant reference potential.

13. The device of claim 12, wherein the non-binary search is performed using a radix of conversion less than two.

14. The device of claim 13, wherein the sequence of digital codes includes a second subset of digital codes, wherein the second subset of digital codes is generated according to a binary search technique.

15. The device of claim 14, wherein in a first operating phase of the device in which the first subset of the sequence of digital codes is generated, the comparator is designed to operate with a first bandwidth and a first gain, wherein in a second operating phase of the device in which the second subset of the sequence of digital codes is generated, the comparator is designed to operate with a second bandwidth and a second gain, wherein the first bandwidth is wider than the second bandwidth, and the first gain is less than the second gain.

16. The device of claim 15, wherein errors in the first subset are corrected in a third operating phase, wherein the third operating phase is between the first operating phase and the second operating phase.

17. The device of claim 16, wherein the binary-weighted DAC comprises a first capacitor bank containing a first plurality of capacitors and a second capacitor bank containing a second plurality of capacitors, wherein codes in the first subset are applied on capacitors of the first capacitor bank, codes in the second subset being applied on capacitors of the second capacitor bank.

18. The device of claim 16, wherein the binary-weighted DAC comprises a plurality of capacitors, wherein codes in the first subset as well as the second subset are applied on capacitors in the plurality of capacitors.

* * * * *